(12) United States Patent
Glaser

(10) Patent No.: US 11,316,340 B2
(45) Date of Patent: Apr. 26, 2022

(54) ELECTROSTATIC DISCHARGE WITH PARASITIC COMPENSATION

(71) Applicant: Infineon Technologies AG, Neubiberg (DE)

(72) Inventor: Ulrich Glaser, Putzbrunn (DE)

(73) Assignee: Infineon Technologies AG, Neubiberg (DE)

(*) Notice: Subject to any disclaimer, the term of this patent is extended or adjusted under 35 U.S.C. 154(b) by 462 days.

(21) Appl. No.: 16/526,627

(22) Filed: Jul. 30, 2019

(65) Prior Publication Data

US 2021/0036510 A1 Feb. 4, 2021

(51) Int. Cl.
*H02H 9/04* (2006.01)
*H01L 27/02* (2006.01)
*H01L 29/866* (2006.01)
*H01L 27/06* (2006.01)

(52) U.S. Cl.
CPC ......... *H02H 9/046* (2013.01); *H01L 27/0255* (2013.01); *H01L 27/0259* (2013.01); *H01L 27/0266* (2013.01); *H01L 27/0292* (2013.01); *H01L 27/0635* (2013.01); *H01L 29/866* (2013.01)

(58) Field of Classification Search
CPC . H02H 9/046; H01L 27/0635; H01L 27/0255; H01L 27/0259; H01L 27/0292; H01L 27/0266; H01L 29/866
USPC .......................................................... 361/56
See application file for complete search history.

(56) References Cited

U.S. PATENT DOCUMENTS

| 5,654,862 A * | 8/1997 | Worley ............ H03K 17/08104 361/111 |
| 5,946,177 A * | 8/1999 | Miller ................. H01L 27/0248 361/56 |
| 7,245,467 B2 * | 7/2007 | Yeh ..................... H01L 27/0259 361/56 |
| 8,643,990 B2 | 2/2014 | Cao et al. |
| 9,225,163 B2 | 12/2015 | Cao et al. |
| 9,413,166 B2 | 8/2016 | Rupp et al. |
| 10,367,350 B2 | 7/2019 | Glaser et al. |
| 2004/0217425 A1* | 11/2004 | Brodsky ............. H01L 27/0248 257/360 |
| 2009/0244797 A1* | 10/2009 | Sawahata ........... H01L 27/0262 361/56 |

(Continued)

FOREIGN PATENT DOCUMENTS

DE    102010030064.0 A1    12/2011

*Primary Examiner* — Kevin J Comber
(74) *Attorney, Agent, or Firm* — Shumaker & Sieffert, P.A.

(57) ABSTRACT

A circuit for preventing failure of a device includes a first rail, electrostatic discharge (ESD) protection circuitry, a second rail, an ESD switching circuitry, biasing circuitry, and a signal limiter. The first rail is for one or more first electrical components formed in a first portion of a substrate. The second rail is for one or more second electrical components formed in a second portion of the substrate. The first portion of the substrate forms an emitter of a parasitic transistor and the second portion of the substrate forms a collector of the parasitic transistor. The biasing circuitry is configured to output a bias voltage at the emitter of the parasitic transistor when the ESD switching circuitry is switched on. The signal limiter electrically couples to the first rail and the emitter of the parasitic transistor.

20 Claims, 11 Drawing Sheets

(56) References Cited

U.S. PATENT DOCUMENTS

| | | | | |
|---|---|---|---|---|
| 2011/0089535 A1* | 4/2011 | Chen | ................... | H01L 27/0251 |
| | | | | 257/565 |
| 2011/0304940 A1* | 12/2011 | Cao | ................ | H02H 9/046 |
| | | | | 361/56 |
| 2012/0236448 A1* | 9/2012 | Hiraoka | ................ | H02H 9/046 |
| | | | | 361/56 |

* cited by examiner

US 11,316,340 B2

ELECTROSTATIC DISCHARGE WITH PARASITIC COMPENSATION

TECHNICAL FIELD

This disclosure relates to techniques for preventing damage relating to electrostatic discharge (ESD) in electric circuits.

BACKGROUND

To prevent damage caused by electrostatic discharge (ESD), electronics manufacturers often include ESD protection circuitry in electronic devices and components such as integrated circuits (ICs) and printed circuit boards (PCBs). An IC with a ground pin and cascaded voltage pins (i.e. pins with different supply voltages), for example, may include ESD protection circuitry to protect the functional circuits between the various pin combinations from both positive and negative ESD stresses. Upon detecting a voltage event across two pins (e.g., an overvoltage or voltage spike that exceeds a threshold) caused for example by an ESD event, the ESD protection circuitry directs current caused by the voltage event away from functional circuitry, for example to a ground.

SUMMARY

In general, this disclosure is directed to techniques for compensating for parasitic components of electrical components formed in a substrate. For example, a circuit may include biasing circuitry configured to output a bias voltage at an emitter of a parasitic transistor when an electrostatic discharge (ESD) switching element is switched on. In this way, biasing circuitry may help to prevent the parasitic transistor from causing damage during an ESD event.

In an example, a circuit includes: a first rail for one or more first electrical components formed in a first portion of a substrate; ESD protection circuitry electrically coupled between the first rail and a reference rail, wherein the ESD protection circuitry is configured to generate an electrically conductive path between the first rail and the reference rail during an ESD event; a second rail for one or more second electrical components formed in a second portion of the substrate, wherein the first portion of the substrate forms an emitter of a parasitic transistor and the second portion of the substrate forms a collector of the parasitic transistor; an ESD switching circuitry electrically coupled between the second rail and the reference rail, wherein the ESD switching circuitry is configured to switch on during the ESD event to generate an electrically conductive path between the second rail and the reference rail; biasing circuitry configured to output a bias voltage at the emitter of the parasitic transistor when the ESD switching circuitry is switched on; and a signal limiter configured to electrically couple the first rail and the emitter of the parasitic transistor.

In another example, a method includes: generating, by ESD protection circuitry, an electrically conductive path between a first rail and a reference rail during an ESD event, wherein the first rail is configured for one or more first electrical components formed in a first portion of a substrate; switching-on an ESD switching circuitry electrically coupled between a second rail and the reference rail during the ESD event to generate an electrically conductive path between the second rail and the reference rail, wherein the second rail is configured for one or more second electrical components formed in a second portion of the substrate, wherein the first portion of the substrate forms an emitter of a parasitic transistor and the second portion of the substrate forms a collector of the parasitic transistor; and outputting a bias voltage at the emitter of the parasitic transistor when the ESD switching circuitry is switched-on, wherein a signal limiter electrically couples the first rail and the emitter of the parasitic transistor.

In another example, a system includes: a reference rail; one or more first electrical components formed in a first portion of a substrate; a first rail for the one or more first electrical components; electrostatic discharge (ESD) protection circuitry electrically coupled between the first rail and the reference rail, wherein the ESD protection circuitry is configured to generate an electrically conductive path between the first rail and the reference rail during an ESD event; one or more second electrical components formed in a second portion of the substrate, wherein the first portion of the substrate forms an emitter of a parasitic transistor and the second portion of the substrate forms a collector of the parasitic transistor; a second rail for the one or more second electrical components; an ESD switching circuitry electrically coupled between the second rail and the reference rail, wherein the ESD switching circuitry is configured to switch on during the ESD event to generate an electrically conductive path between the second rail and the reference rail; biasing circuitry configured to output a bias voltage at the emitter of the parasitic transistor when the ESD switching circuitry is switched-on; and a signal limiter configured to electrically couple the first rail and the emitter of the parasitic transistor.

Details of these and other examples are set forth in the accompanying drawings and the description below. Other features, objects, and advantages will be apparent from the description and drawings, and from the claims.

DETAILED DESCRIPTION

This disclosure is directed to techniques for compensating for parasitics in circuits with electrostatic discharge (ESD) protection. For example, ESD stresses can occur between any two subgroups of product pins. The ESD qualification of a product may stress a selection of these subgroups, also called pin combinations. A parasitic transistor (e.g., an NPN-bipolar transistor) can be biased by the ESD stress in some of these pin combinations in the following way: the base/emitter junction of the parasitic transistor is forward biased while the base/collector junction of the parasitic transistor is reverse biased. Such bias of the parasitic transistor may result in damage of the parasitic transistor.

Some systems may limit damage caused by the parasitic transistor by tuning the parasitic transistor. For example, such systems may tune the parasitic transistor to increase base doping and increase base width of the parasitic transistor to reduce the current gain. Some systems may apply guard rings around emitters. However, such systems may merely help to reduce damage caused by the parasitic transistor. Additionally, guard rings and increased base width increase area may increase costs and layout and/or floor planning complexity compared to systems that omit guard rings and increasing the base width. Moreover, increased base doping impacts technology development and increases development costs compared to systems that do not tune the parasitic transistor. Further, tuning the parasitic transistor and using guard rings may not be feasible applications that use relatively high voltages (e.g. above 50 Volts). For example, the increase of base doping may not be feasible in applications that use relatively high voltages because the increase of base doping may contradict the break down voltage requirement of the junction isolation.

In accordance with techniques described herein, a system may be configured to provide a bias voltage during ESD stresses and apply the bias voltage to possible emitters of one or more parasitic transistors. Applying the bias voltage to emitters of parasitic transistors may prevent the emitter/base forward bias of each parasitic transistor and therefore prevent activation and damage of the one or more parasitic transistors. Applying the bias voltage may also be used in applications that use relatively higher voltages (e.g., even into the breakdown of the collector/base junction of the parasitic bipolar transistor). Such systems may help to prevent current injection from emitter into the base compared to systems that do not apply the bias voltage. Applying the bias voltage may be effective without any distance requirements (e.g., area costs, layout/floor planning complexity, etc.).

Figure 1A:
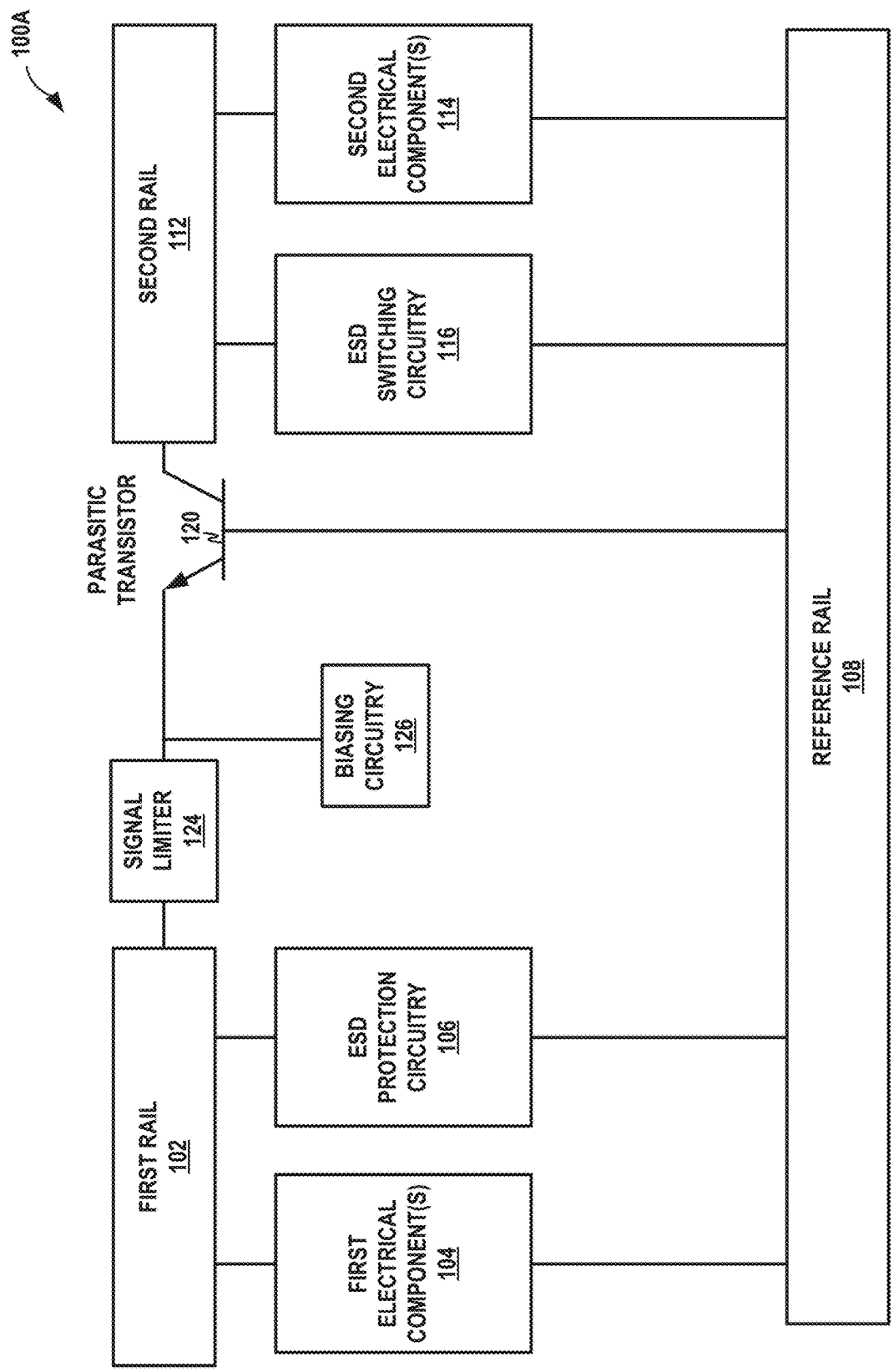
FIG. 1A is a block diagram illustrating an example system for electrostatic discharge with parasitic compensation, in accordance with one or more techniques of this disclosure.

FIG. 1A is a block diagram illustrating an example system 100A for electrostatic discharge with parasitic compensation, in accordance with one or more techniques of this disclosure. As illustrated in the example of FIG. 1A, system 100A may include first rail 102, one or more first electrical components 104 (also referred to herein as "first electrical components 104), ESD protection circuitry 106, reference rail 108, second rail 112, one or more second electrical components 114 (also referred to herein as "second electrical components 114), ESD switching circuitry 116, parasitic transistor 120, signal limiter 124, and biasing circuitry 126. First rail 102 may be a supply rail, Input/Output (I/O) rail, or another rail. Second rail 112 may be a supply rail, I/O rail, or another rail. Electrical components 104 may include analog, digital, or analog and digital elements formed in a first portion of a substrate. Similarly, electrical components 114 may include analog, digital, or analog and digital elements formed in a second portion of a substrate.

ESD protection circuity 106 may be configured to generate an electrically conductive path between first rail 102 and reference rail 108 during an ESD event. As used herein, an ESD event may refer to instances where a voltage at first rail 102 exceeds a threshold, a voltage at second rail 112 exceeds a threshold, a voltage at reference rail 108 exceeds a threshold, or voltage at another rail exceeds a threshold. ESD protection circuitry 106 may be configured to electronically couple first rail 102 (e.g., voltage rail) and reference rail 108 (e.g., earth ground, ground plane, or a reference node) during an ESD event. ESD protection circuitry 106 may include a diode (e.g., a Zener diode) configured to electronically couple first rail 102 and reference rail 108 during the ESD event. ESD protection circuitry 106 may include a switching element configured to electronically couple first rail 102 and reference rail 108 during the ESD event. Examples of switching elements may include, but are not limited to, a Silicon Controlled Rectifier (SCR), a Field Effect Transistor (FET), and a Bipolar Junction Transistor (BJT). Examples of FETs may include, but are not limited to, Junction Field-Effect transistor (JFET), Metal-Oxide-Semiconductor FET (MOSFET), dual-gate MOSFET, Fin-FETs, Insulated-Gate Bipolar Transistor (IGBT), any other type of FET, or any combination of the same. Examples of MOSFETS may include, but are not limited to, PMOS, NMOS, DMOS, or any other type of MOSFET, or any combination of the same. Examples of BJTs may include, but are not limited to, PNP, NPN, heterojunction, or any other type of BJT, or any combination of the same. Switching elements may be voltage-controlled and/or current-controlled. Examples of current-controlled switching elements may include, but are not limited to, gallium nitride (GaN) MOSFETs, BJTs, or other current-controlled elements. As shown, ESD protection circuitry 106 may be coupled between first rail 102 and reference rail 108.

ESD switching circuitry 116 may be configured to generate an electrically conductive path between second rail 112 and reference rail 108 during an ESD event. For example, ESD switching circuitry 116 may be configured to electronically couple second rail 112 (e.g., voltage rail) and reference rail 108 (e.g., earth ground, ground plane, or a reference node) during an ESD event. ESD switching circuitry 116 may include a switch or switching element configured to electronically couple second rail 112 and reference rail 108 during the ESD event. In some examples, ESD switching circuitry 116 may include a PN-type device (e.g., a Zener or avalanche diode) with a P-junction (e.g., an anode) electrically coupled to reference rail 108. As shown, ESD switching circuitry 116 may be coupled between second rail 112 and reference rail 108.

Parasitic transistor 120 may be a parasitic structure resulting from forming first electrical components 104 and second electrical components 114. For example, first electrical components 104 may be formed in a first portion of a substrate that forms an emitter of parasitic transistor 120 and second electrical components 114 may be formed in a second portion of a substrate that forms a collector of parasitic transistor 120.

Signal limiter 124 may be configured to electrically couple first rail 102 and the emitter of parasitic transistor 120. In some examples, signal limiter 124 includes a diode comprising an anode electrically coupled to first rail 102 and a cathode electrically coupled to an emitter of parasitic transistor 120. In some examples, signal limiter 124 includes a resistive element (e.g., a resistor) comprising a first node electrically coupled to first rail 102 and a second node electrically coupled to the emitter of parasitic transistor 120.

ESD protection circuitry 106 may be configured to drive voltage at first rail 102 to be less than voltage at reference rail 108 when ESD protection circuitry 106 generates the electrically conductive path between first rail 102 and reference rail 108 during an ESD event. In accordance with techniques described herein, biasing circuitry 126 may be configured to output a bias voltage at the emitter of parasitic transistor 120 when ESD switching circuitry 116 is switched on. In some examples, biasing circuitry 126 may be configured to output the bias voltage to be greater than voltage at reference rail 108 during the ESD event. For example, biasing circuitry 126 may be configured to output a voltage that is greater than a voltage at reference rail 108. For instances, biasing circuitry 126 may be configured to output a voltage derived from a voltage at first rail 102, second rail 112, a gate voltage at a switching element of ESD switching circuitry 116, a regulated voltage, or another voltage that is greater than voltage at reference rail 108. In some examples, biasing circuitry 126 may be configured to output the bias voltage to correspond to voltage at reference rail 108 during an ESD event. For instances, biasing circuitry 126 may be configured to output voltage at reference rail 108. In this way, biasing circuitry 126 may prevent damage of parasitic transistor 120.

Figure 1B:
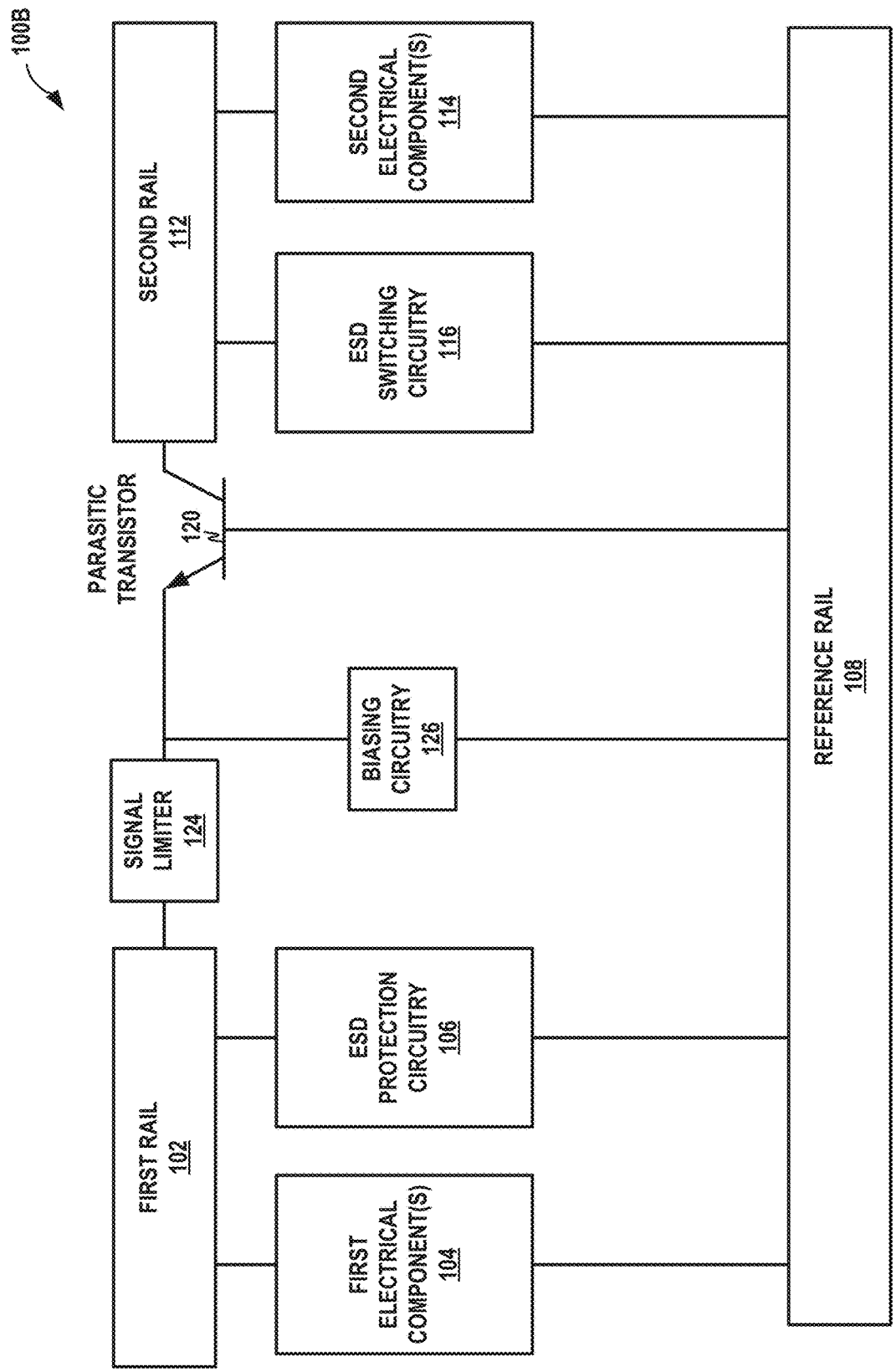
FIG. 1B is a block diagram illustrating an example system for electrostatic discharge with parasitic compensation and with biasing circuitry coupled to a reference rail, in accordance with one or more techniques of this disclosure.

FIG. 1B is a block diagram illustrating an example system 100B for electrostatic discharge with parasitic compensation with biasing circuitry 126 coupled to reference rail 108, in accordance with one or more techniques of this disclosure. In the example of FIG. 1B, biasing circuitry 126 may output a voltage derived from a voltage at reference rail 108 to the emitter of parasitic transistor 120 during an ESD event.

Figure 1C:
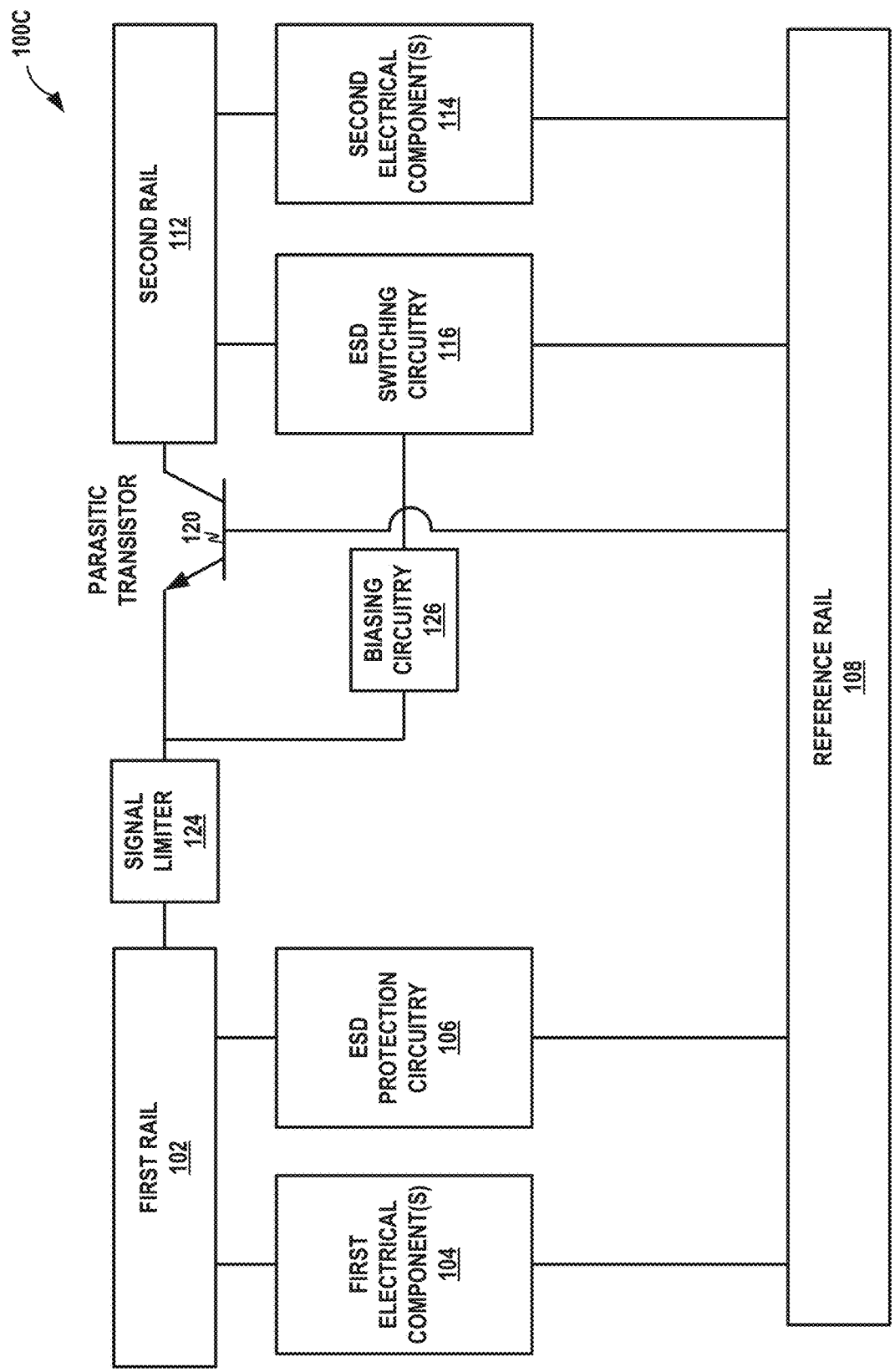
FIG. 1C is a block diagram illustrating an example system for electrostatic discharge with parasitic compensation and with biasing circuitry coupled to an ESD switching circuitry, in accordance with one or more techniques of this disclosure.

FIG. 1C is a block diagram illustrating an example system 100C for electrostatic discharge with parasitic compensation with biasing circuitry coupled to ESD switching circuitry 116, in accordance with one or more techniques of this disclosure. In the example of FIG. 1C, biasing circuitry 126 may output a voltage derived from a gate voltage being applied to a gate of a switching element of ESD switching circuitry 116 to the emitter of parasitic transistor 120 during an ESD event.

Figure 1D:
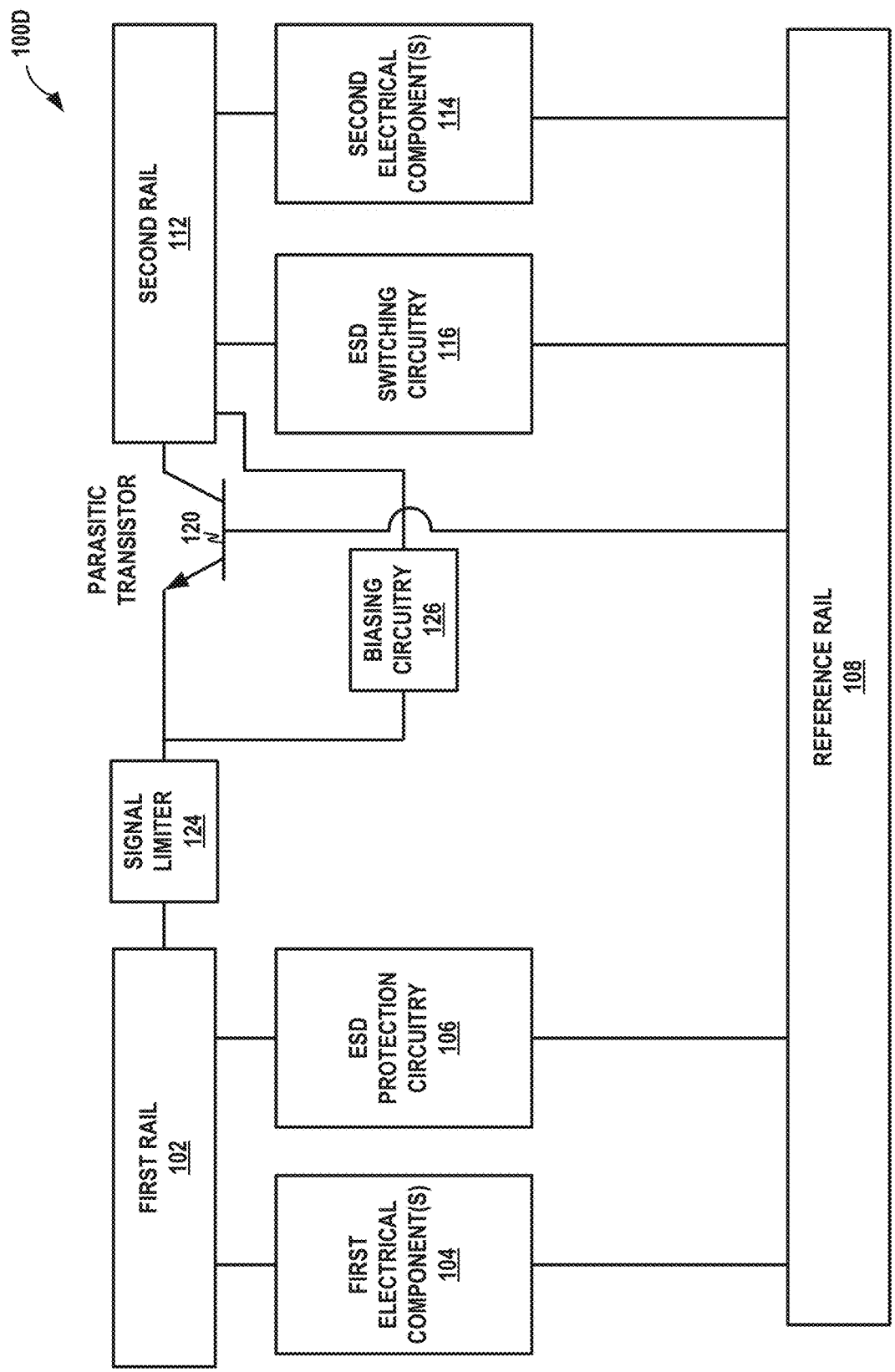
FIG. 1D is a block diagram illustrating an example system for electrostatic discharge with parasitic compensation and with biasing circuitry coupled to a second rail, in accordance with one or more techniques of this disclosure.

FIG. 1D is a block diagram illustrating an example system 100D for electrostatic discharge with parasitic compensation with biasing circuitry coupled to second rail 112, in accordance with one or more techniques of this disclosure. In the example of FIG. 1D, biasing circuitry 126 may output a voltage derived from a voltage at second rail 112 to the emitter of parasitic transistor 120 during an ESD event.

Figure 2A:
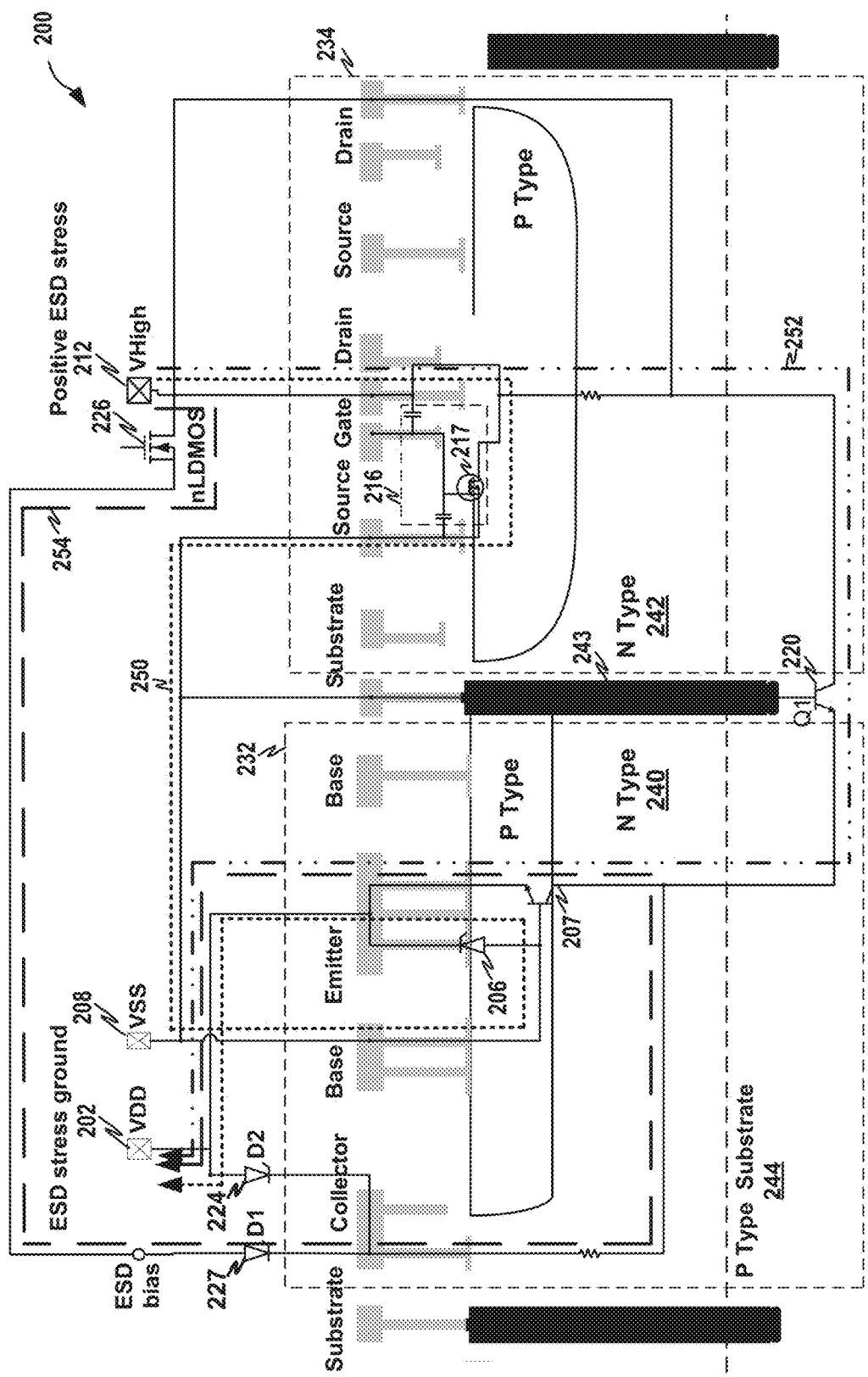
FIG. 2A is a conceptual diagram illustrating a cross-section of an example system for electrostatic discharge with parasitic compensation, in accordance with one or more techniques of this disclosure.

FIG. 2A is a conceptual diagram illustrating a cross section of an example system 200 for electrostatic discharge with parasitic compensation, in accordance with one or more techniques of this disclosure. VDD 202, diode 206, Vhigh 212, active ESD clamp 216, VSS 208, parasitic transistor 220, diode 224, and biasing circuitry 226, may be examples of first rail 102, ESD protection circuitry 106, second rail 112, ESD switching circuitry 116, reference rail 108, parasitic transistor 120, signal limiter 124, and biasing circuitry 126 of FIGS. 1A-1D. In the example of FIG. 2A, first portion 232 may represent a portion of a substrate for a first electrical component, diode 206, (e.g., a Zener NPN) and second portion 234 may represent a portion of a substrate for a second electrical component, transistor 217 (e.g., an n-Channel Laterally Diffused Metal-Oxide-Semiconductor (NLDMOS)). In the example of FIG. 2A, first portion 232 includes N-type layer 240 (e.g., n+ buried layer (BL)) and second portion 234 includes N-type layer 242. In this example, N-type layer 240 and N-type layer 242 are separated by deep trench isolation (DTI) 243. As shown, N-type layer 240 and N-type layer 242 may be formed on a common P-type layer, such as, but not limited to, P-type substrate 244. While the example of FIG. 2A includes only two rails, VDD 202 and Vhigh 212, and a reference rail, VSS 208, other examples may include more than two rails and a reference rail.

In the example shown in FIG. 2A, ESD protection circuitry between VDD 202 and VSS 208 is provided by diode 206, which includes parasitic transistor 207 (e.g., a Zener NPN). As shown, parasitic transistor 207 includes an emitter electrically coupled to VDD 202, a collector electrically coupled to the emitter of parasitic transistor 220, and a base electrically coupled to VSS 208.

FIG. 2A illustrates a presence of a parasitic transistor 220 (e.g., a parasitic substrate NPN-bipolar transistor "Q1"). Parasitic transistor 220 may include N-type layer 240 (e.g., an n+ BL area) and N-type layer 242 (e.g., an n+ BL area), which are separated by DTI 243. N-type layer 240 may form an emitter of parasitic transistor 220. N-type layer 242 may form a collector of parasitic transistor 220. P-type substrate 244 may form a base of parasitic transistor 220. In this example, N-type layer 240 may form an isolation (e.g., collector of parasitic transistor 207) of a diode 206 (e.g., emitter and base of parasitic transistor 207) and N-type layer 242 is connected to a drain terminal of transistor 217 (e.g., nLDMOS) of active ESD clamp 216. However, in other examples, a parasitic transistor may be formed with different electrical components.

In the example of FIG. 2A, a cathode of the diode 206, which is coupled to an emitter of parasitic transistor 207, is connected to VDD 202 together with the isolation (e.g., N-type layer 240) of diode 206, which is coupled to a collector of parasitic transistor 207. Accordingly, positive ESD stress at Vhigh 212 may result in current flow 250 from Vhigh 212 through transistor 217 and diode 206 to VDD 202. For instance, current flow 250 may result in N-type layer 240 being at a voltage corresponding to VDD 202. Transistor 217 may electrically couple Vhigh 212 to VSS 208. As such, current flow 250 may result in N-type layer 242 being at a voltage corresponding to Vhigh 212. Parasitic transistor 220 may include N-type layer 240, N-type layer 242, and P-type substrate 244, which is connected to VSS 208. In this way, ESD stress at Vhigh 212 may result in current flow 250, which may cause current flow 252 through parasitic transistor 220, thereby resulting in damage to P-type substrate 244, N-type layer 240, and/or N-type layer 242.

In accordance with techniques described herein, biasing circuitry 226 (e.g., an nLDMOS transistor) may be configured to output a bias voltage at the emitter of parasitic transistor 220 when transistor 217 is switched on, which results in current flow 254. In this way, biasing circuitry 226 may prevent current flow 252 through parasitic transistor 220 to prevent potentially damage to P-type substrate 244, N-type layer 240, and/or N-type layer 242.

Figure 2B:
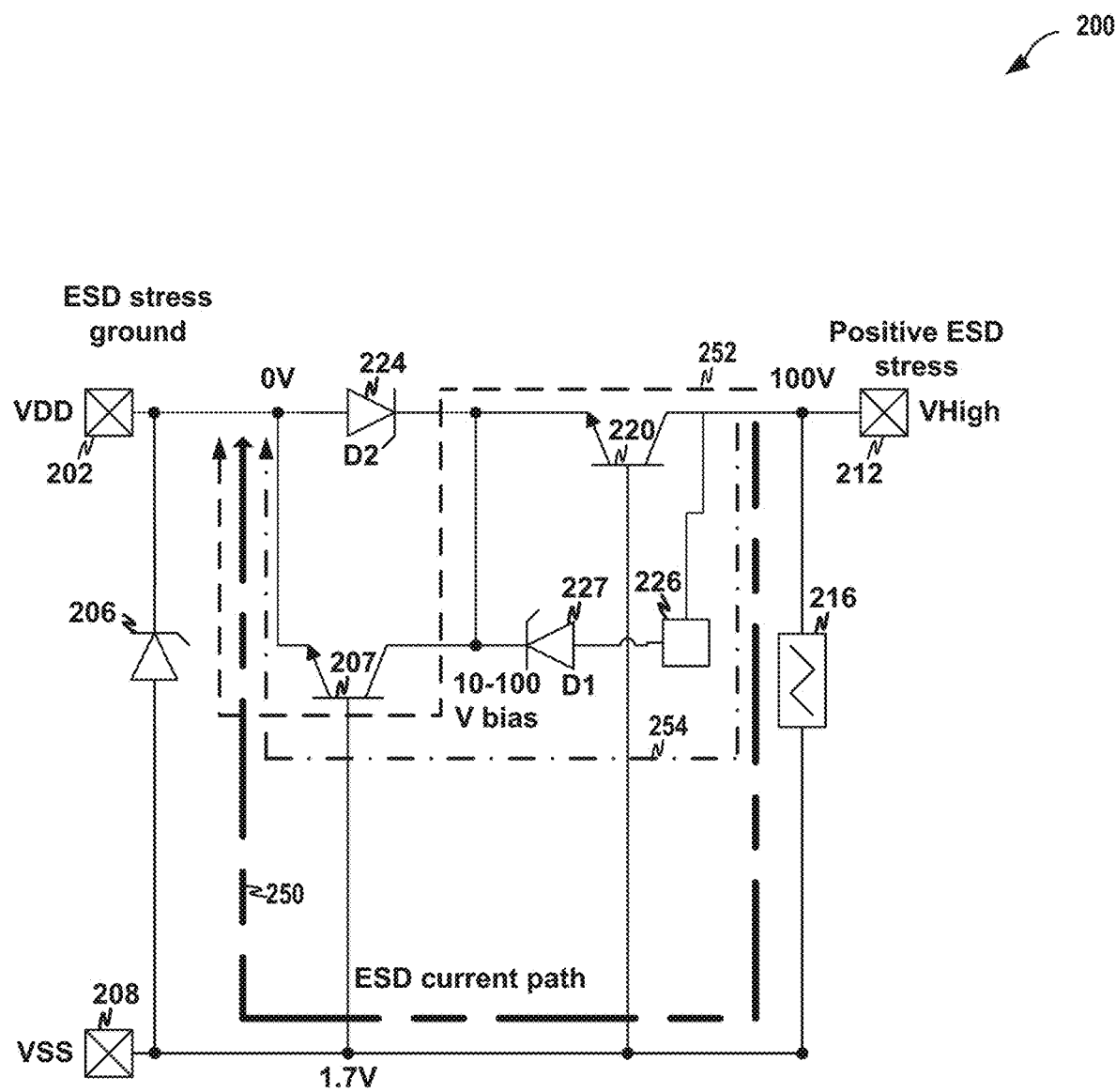
FIG. 2B is a conceptual diagram illustrating first example biasing circuitry of the system for electrostatic discharge with parasitic compensation of FIG. 2A, in accordance with one or more techniques of this disclosure.

FIG. 2B is a conceptual diagram illustrating first example biasing circuitry 226 of the system 200 for electrostatic discharge with parasitic compensation of FIG. 2A, in accordance with one or more techniques of this disclosure. FIG. 2B illustrates an example, where parasitic transistor 220 exists in circuitry and how the bias condition for parasitic transistor 220 arises during an ESD stress. In other examples, a parasitic transistor may be formed using different electrical components.

ESD protection devices may be positioned between Vhigh 212 and VSS 208, as well as between VDD 202 and VSS 208. In the example of FIG. 2B, an active ESD clamp 216 is positioned between Vhigh 212 and VSS 208 and diode 206 (e.g., a Zener diode) is positioned between VDD 202 and VSS 208.

If a positive ESD stress occurs on the pin for Vhigh 212 versus the pin for VDD 202, which is on the ESD stress ground, ESD current may flow along the ESD current flow 250, e.g. across the active ESD clamp 216 between Vhigh 212 and VSS 202, along a VSS metal line and across the diode 206 between VDD 202 and VSS 208. In this example, a voltage of about 100 Volts drops across active ESD clamp 216 while a voltage of about 1.7 Volts drops across diode 206, which is forward biased in this stress condition. P-type substrate 244, which is connected to VSS 208, may therefore be forward biased by about 1.7 Volts compared to N-type layer 240 of parasitic transistor 207 while N-type layer 242 of active ESD clamp 216 is at a high voltage of about 100 Volts. As such, the base and/or emitter junction of parasitic transistor 220 is turned on while the collector is at a high potential, which may result in current flow 252. However, current flow 252 may cause strong heating in P-type substrate 244 and/or N-type layer 242, which in this example is reverse biased by about 100 Volts. The examples illustrated in FIGS. 2A, 2B are solely for illustration. In some examples, many supply and I/O pins exist which connect to equivalent parasitic bipolar transistors and may also generate such critical ESD stress conditions.

In accordance with techniques described herein, biasing circuitry 226 may be configured to output a bias voltage, via diode 227, at the emitter of parasitic transistor 220 when transistor 217 is switched on, which results in current flow 254. For example, biasing circuitry 226 may include a switching element that couples Vhigh 212 to the emitter of parasitic transistor 220 during an ESD event. Diode 227 may connect the bias voltage (e.g., about 10-100 Volts) to N-type layer 240 of diode 206 during an ESD event. As such, biasing circuitry 226 may reverse bias the emitter and/or base junction of parasitic transistor 220 to prevent current flow 252. Diode 224 may provide bias during normal operation when VDD 202 is, for example, 5 Volts. In this way, biasing circuitry 226 may prevent current flow 252 through parasitic transistor 220 to prevent potentially damage to P-type substrate 244, N-type layer 240, and/or N-type layer 242.

Figure 3:
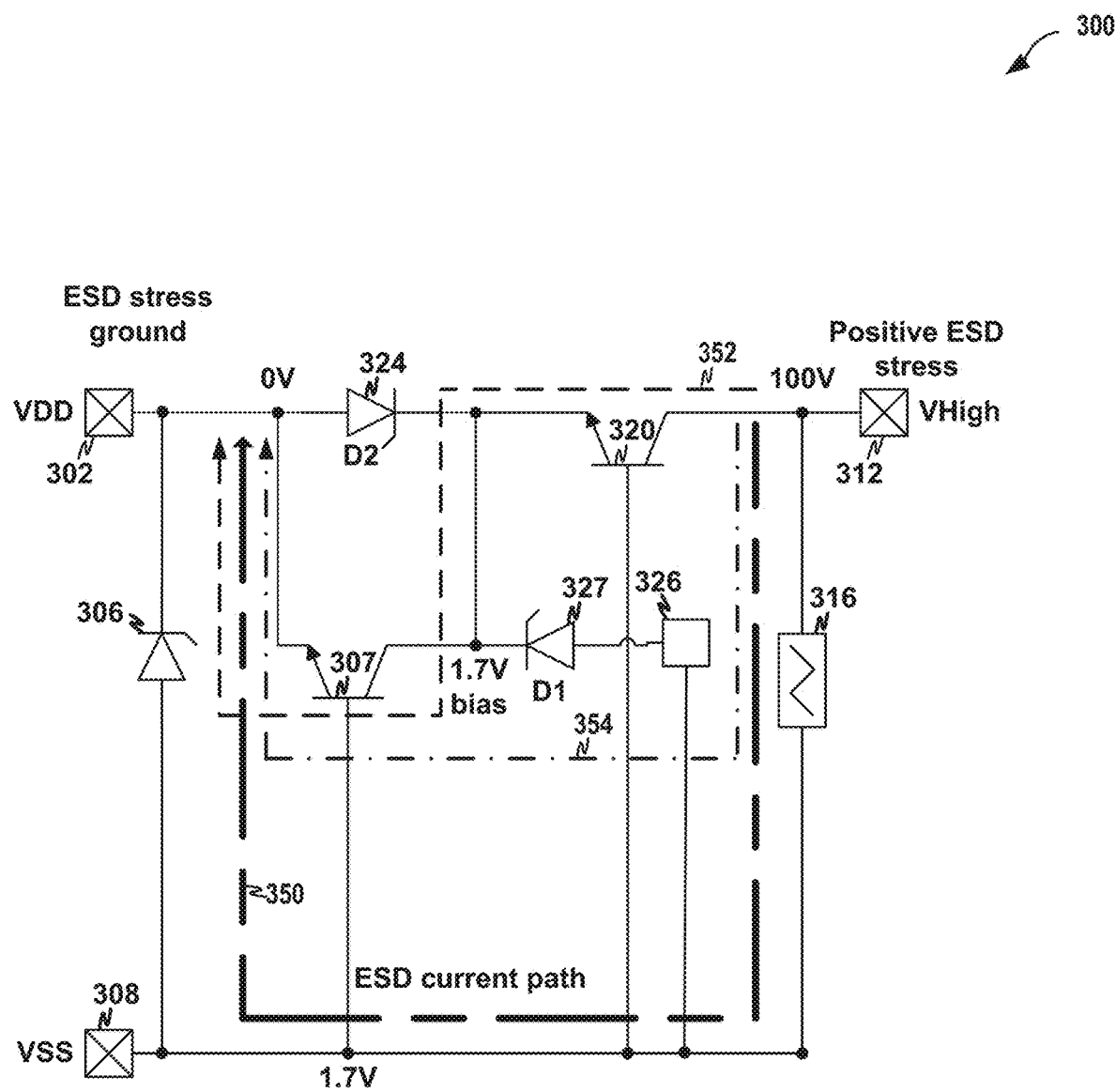
FIG. 3 is a conceptual diagram illustrating second example biasing circuitry with parasitics compensation, in accordance with one or more techniques of this disclosure.

FIG. 3 is a conceptual diagram illustrating second example biasing circuitry 326 with parasitics compensation, in accordance with one or more techniques of this disclosure. FIG. 3 is described with reference to FIGS. 1A-1D and 2A-2B for example purposes only. VDD 302, diode 306, Vhigh 312, active ESD clamp 316, VSS 308, parasitic transistor 320, diode 324, and biasing circuitry 326 may be examples of first rail 102, ESD protection circuitry 106, second rail 112, ESD switching circuitry 116, reference rail 108, parasitic transistor 120, signal limiter 124, and biasing circuitry 126 of FIGS. 1A, 1B.

If a positive ESD stress occurs on the pin for Vhigh 312 versus the pin for VDD 302, which is on the ESD stress ground, the ESD current may flow along the ESD current path 350, e.g. across the active ESD clamp 316 between Vhigh 312 and VSS 308, along a VSS metal line and across the diode 306, which includes parasitic transistor 307 (e.g., a Zener NPN), between VDD 302 and VSS 308. As such, the base and/or emitter junction of parasitic transistor 320 is turned on while the collector is at a high potential, which may result in parasitic current flow 352.

In the example of FIG. 3, however, biasing circuitry 326 may be coupled to VSS 308. For example, biasing circuitry 326 may include a switching element that couples VSS 308, via diode 327, to the emitter of parasitic transistor 320 during an ESD event, which results in current flow 354. As such, biasing circuitry 326 may output a bias voltage (e.g., about 1.7 Volts) at VSS 308 to the emitter of parasitic transistor 320. In this way, biasing circuitry 326 may prevent current flow 352 through parasitic transistor 320 to potentially prevent damage.

Figure 4:
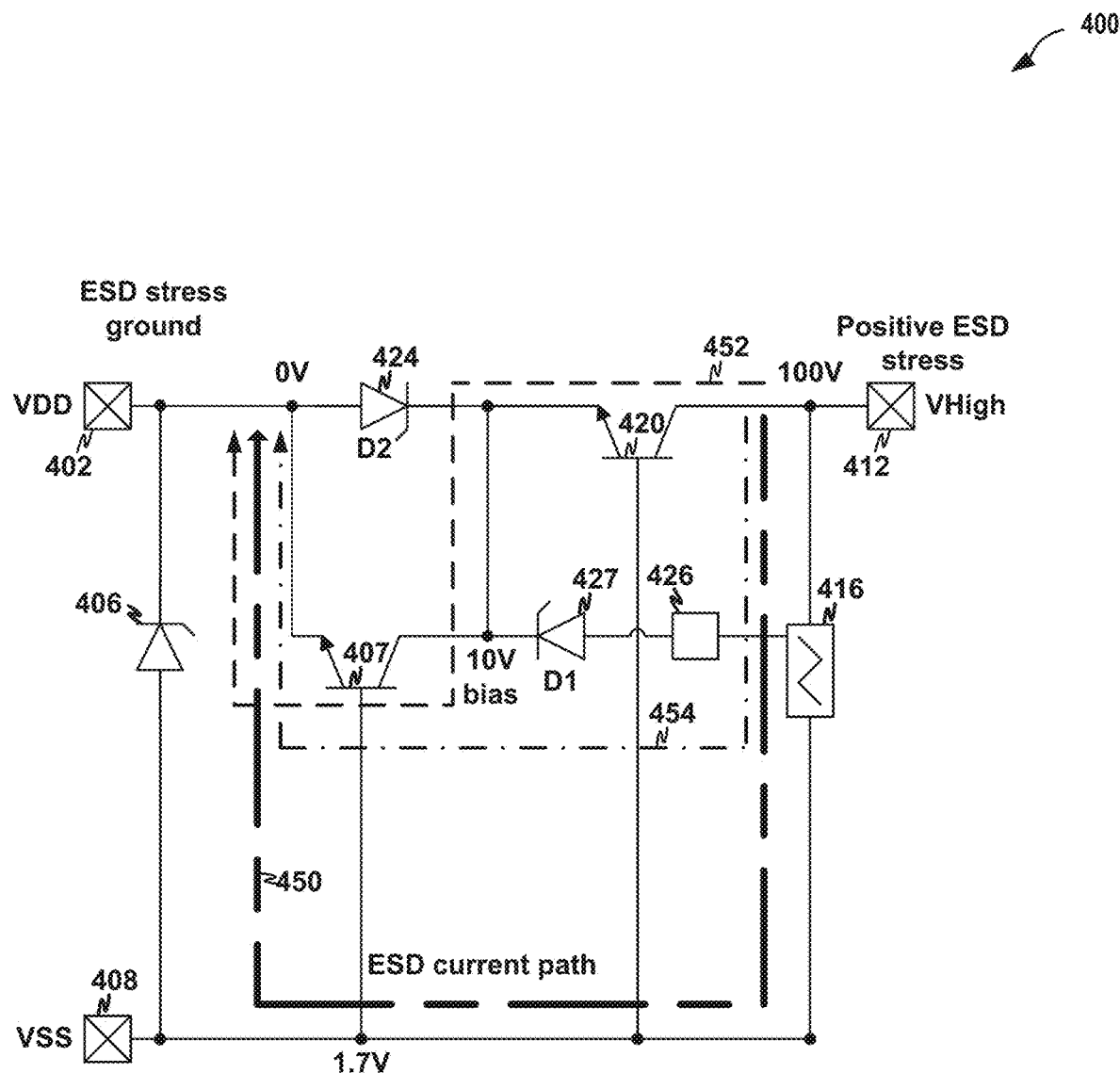
FIG. 4 is a conceptual diagram illustrating third example biasing circuitry with parasitics compensation, in accordance with one or more techniques of this disclosure.

FIG. 4 is a conceptual diagram illustrating third example biasing circuitry 426 with parasitics compensation, in accordance with one or more techniques of this disclosure. FIG. 4 is described with reference to FIGS. 1A-1D, 2A-2B, and 3 for example purposes only. VDD 402, diode 406, Vhigh 412, active ESD clamp 416, VSS 408, parasitic transistor 420, diode 424, and biasing circuitry 426 may be examples of first rail 102, ESD protection circuitry 106, second rail 112, ESD switching circuitry 116, reference rail 108, parasitic transistor 120, signal limiter 124, and biasing circuitry 126 of FIGS. 1A, 1B.

If a positive ESD stress occurs on the pin for Vhigh 412 versus the pin for VDD 402, which is on the ESD stress ground, the ESD current may flow along the ESD current path 450, e.g. across the active ESD clamp 416 between Vhigh 412 and VSS 408, along a VSS metal line and across the Zener diode 407 between VDD 402 and VSS 408. As such, the base and/or emitter junction of parasitic transistor 420 is turned on while the collector is at a high potential, which may result in parasitic current flow 452.

In the example of FIG. 4, however, biasing circuitry 426 may be coupled to a gate of active ESD clamp 416 to the emitter of parasitic transistor 420 during an ESD event. For example, biasing circuitry 426 may include a switching element that couples, via diode 427, the gate of active ESD clamp 416 to the emitter of parasitic transistor 420 during an ESD event, which results in current flow 454. As such, biasing circuitry 426 may output a bias voltage (e.g., about 10 Volts) at the gate of active ESD clamp 416 to the emitter of parasitic transistor 420. In this way, biasing circuitry 426 may prevent current flow 452 through parasitic transistor 420 to potentially prevent damage.

Figure 5:
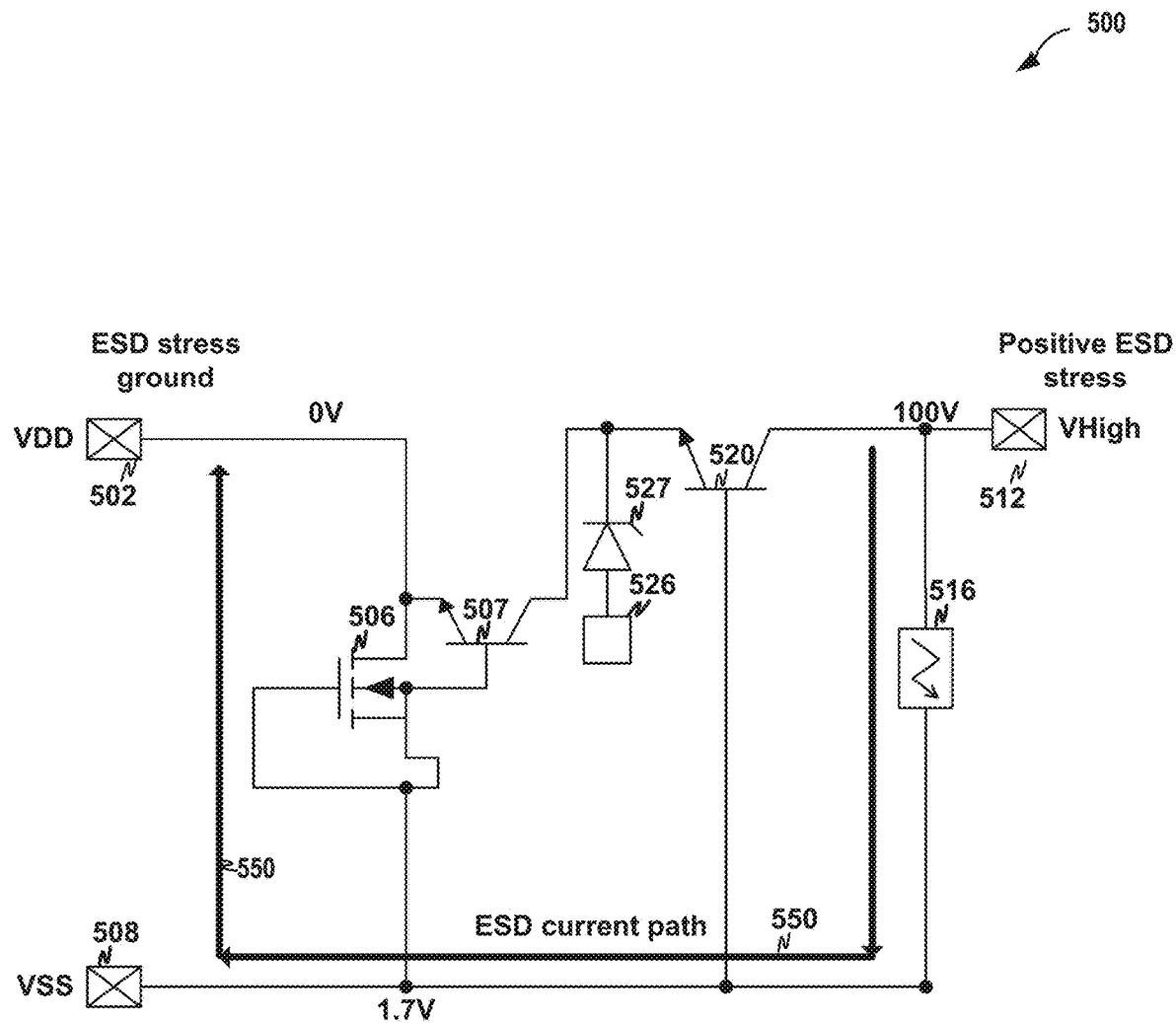
FIG. 5 is a conceptual diagram illustrating biasing circuitry with parasitics compensation for ESD protection circuitry with a switching element, in accordance with one or more techniques of this disclosure.

FIG. 5 is a conceptual diagram illustrating biasing circuitry with parasitics compensation for ESD protection circuitry with a switching element, in accordance with one or more techniques of this disclosure. FIG. 5 is described with reference to FIGS. 1A-1D, 2A-2B, 3, and 4 for example purposes only. VDD 502, switching element 506, Vhigh 512, active ESD clamp 516, VSS 508, parasitic transistor 520, diode 524, and biasing circuitry 526 may be examples of first rail 102, ESD protection circuitry 106, second rail 112, ESD switching circuitry 116, reference rail 108, parasitic transistor 120, signal limiter 124, and biasing circuitry 126 of FIGS. 1A, 1B.

In this example, the ESD protection circuitry between VDD 502 and VSS 508 is provided by switching element 506, which includes parasitic transistor 507. As shown, parasitic transistor 507 comprises an emitter electrically coupled to VDD 502, a collector electrically coupled to the emitter of parasitic transistor 520, and a base electrically coupled to VSS 508. Switching element 506 is electrically coupled between VDD 502 and VSS 508 and configured to generate an electrically conductive path between VDD 502 and VSS 508 during an ESD event. If a positive ESD stress occurs to the pin for Vhigh 512 versus the pin for VDD 502, which is on the ESD stress ground, the ESD current may flow along the ESD current path 550, e.g. across the active ESD clamp 516 between Vhigh 512 and VSS 508, along a VSS metal line and across switching element 506 between VDD 502 and VSS 508.

In the example of FIG. 5, however, biasing circuitry 526 may be configured to output a bias voltage at the emitter of parasitic transistor 520 when the ESD switching circuitry is switched on. For example, biasing circuitry 526 may be configured to couple a gate of active ESD clamp 516 to the emitter of parasitic transistor 520 during an ESD event. In some examples, biasing circuitry 526 may be configured to couple Vhigh 512 to the emitter of parasitic transistor 520 during an ESD event. In some examples, biasing circuitry 526 may be configured to couple VSS 508 to the emitter of parasitic transistor 520 during an ESD event. In this way, biasing circuitry 526 may prevent current flow through parasitic transistor 520 to potentially prevent damage.

Figure 6:
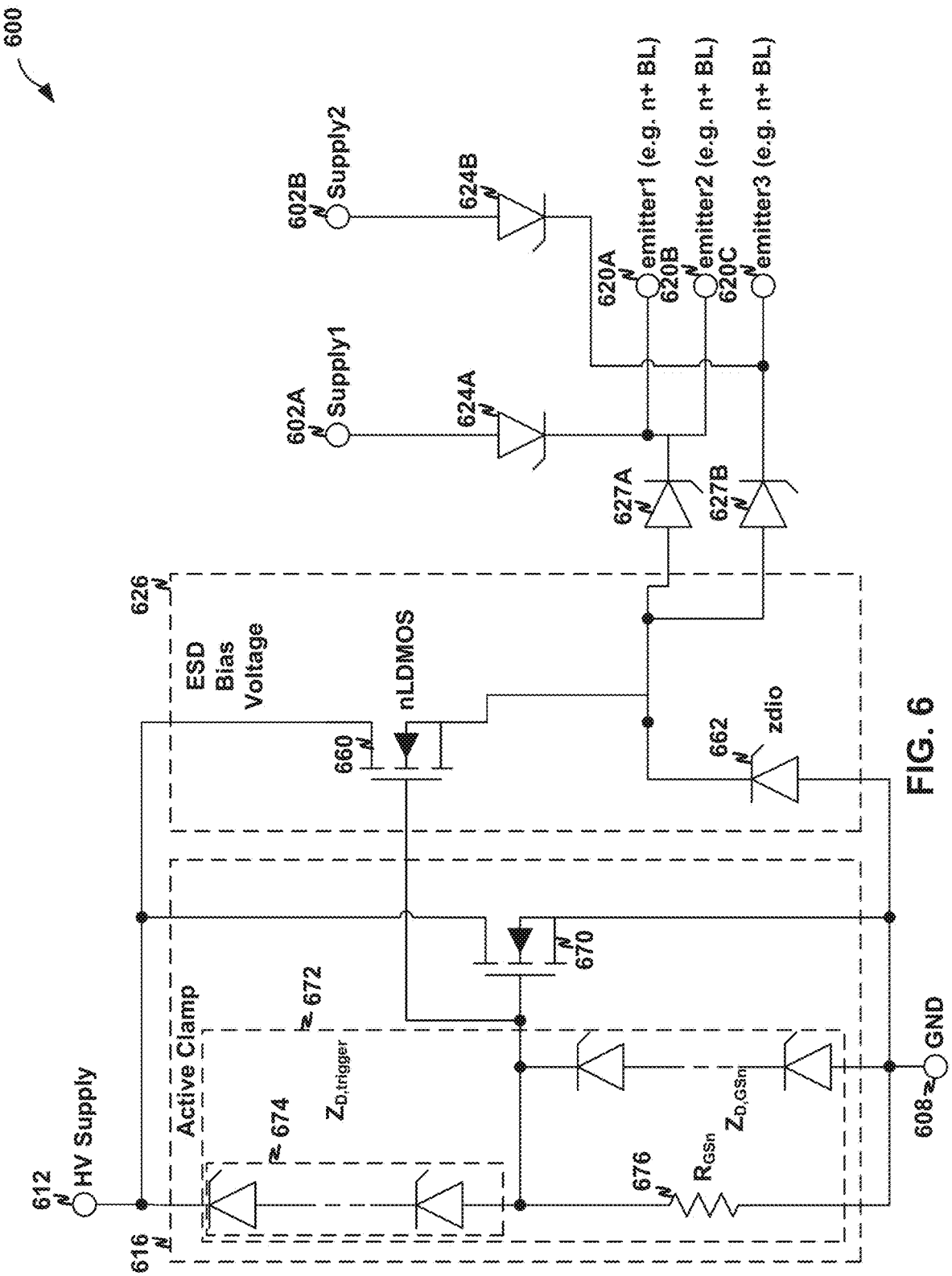
FIG. 6 is a block diagram illustrating an example circuit for electrostatic discharge with parasitic compensation for multiple parasitic transistors, in accordance with one or more techniques of this disclosure.

FIG. 6 is a block diagram illustrating an example circuit for electrostatic discharge with parasitic compensation for multiple parasitic transistors, in accordance with one or more techniques of this disclosure. FIG. 6 is described with reference to FIGS. 1A-1D, 2A-2B, 3, 4, and 5 for example purposes only. Supply1 602A, HV supply 612, active clamp 616, GND 608, diode 624A, and biasing circuitry 626 may be examples of first rail 102, second rail 112, ESD switching circuitry 116, reference rail 108, signal limiter 124, and biasing circuitry 126 of FIGS. 1A, 1B. As shown, the example of FIG. 6 further includes supply2 602B and diode 624B. While the example of FIG. 6 illustrates HV supply 612 and two supplies (e.g., supply1 602A and supply2 602B), other examples may include HV supply 612 and more than two supplies.

Active clamp 616 may include pass element 670 and triggering circuitry 672. Pass element 670 may include a control node, a first node electrically coupled to HV supply 612, and a second node electrically coupled to GND 608. Triggering circuitry 672 may include one or more triggering elements 674 arranged in a series string and resistive element 676. As used herein, a triggering elements may include, for example, but not limited to, one or more of a Zener diode, a thyristor, a bipolar transistor, an avalanche diode, a MOS transistor, a forward biased diode, or another triggering element. As shown, a first end of the series string of triggering elements 674 may be electrically coupled to HV supply 612 and a second end of the series string is electrically coupled to the control node of pass element 670. Resistance element 676 (e.g., a resistor) may include a first node electrically coupled to the control node of pass element 670 and a second node electrically coupled to GND 608. In some examples, active clamp 616 may include a resistor-capacitor (RC) trigger element.

Biasing circuitry 626 may include a source-follower element 660 (e.g., an nLDMOS transistor) and diode 662. Diode 662 may include an anode electrically coupled to GND 608 and a cathode electrically coupled to the second node of source-follower element 660. Source-follower element 660 may include a control node electrically coupled to the control node of pass element 670, a first node electrically coupled to HV supply 612, and a second node electrically coupled to the anode of diode 627A. In some examples, the second node of source-follower element 660 may be electrically coupled to a node of more than one diodes to one or more emitters of parasitic transistors. For example, biasing circuitry 626 may be configured to output, via diode 627A, the bias voltage at an emitter of a first parasitic transistor 620A and output, via diode 627B, the bias voltage at an emitter of a second parasitic transistor 620B when the ESD switching circuitry is switched on. In the example of FIG. 6, biasing circuitry 626 may output, via diode 627C, the bias voltage at an emitter of a third parasitic transistor 620C when the ESD switching circuitry is switched on.

In the example of FIG. 6, source-follower element 660 generates the ESD bias voltage. A gate terminal of source-follower element 660 may be connected to a trigger signal of active clamp 616 (e.g., an output of triggering circuitry 672). However, in other cases biasing circuitry 626 may be connected differently. For instance, biasing circuitry 626 may be connected to supply1 602A, supply2 602B, HV supply 612, GND 608, or another rail or node. The drain of source-follower element 660 may be connected to HV supply 612. Source-follower element 660 may allow the bias voltage to be available in response to triggering active clamp 616 (e.g., simultaneously).

Figure 7:
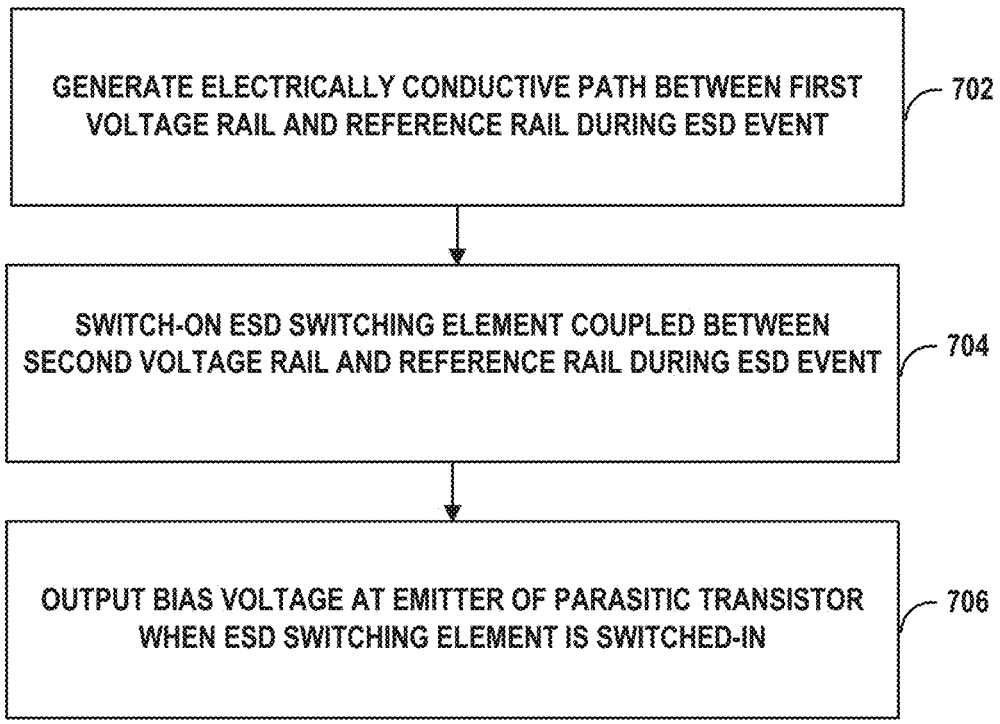
FIG. 7 is a flow diagram illustrating a process for preventing failure of a device, in accordance with this disclosure.

FIG. 7 is a flow diagram illustrating a process for preventing failure of a device, in accordance with this disclosure. FIG. 7 is discussed with reference to FIGS. 1A-1D, 2A, 2B, 3, 4, 5, and 6 for example purposes only. ESD protection circuitry 106 generates an electrically conductive path between first rail 102 and reference rail 108 during an ESD event (702). In some examples, first rail 102 is configured for one or more first electrical components 104 formed in a first portion of a substrate. ESD switching circuitry 116 which is electrically coupled between second rail 112 and reference rail 108 switches on during the ESD event to generate an electrically conductive path between second rail 12 and reference rail 108 (704). In some examples, second rail 112 is configured for one or more second electrical components 114 formed in a second portion of the substrate. In some examples, the first portion of the substrate forms an emitter of parasitic transistor 120 and the second portion of the substrate forms a collector of parasitic transistor 120. Biasing circuitry 126 outputs a bias voltage at the emitter of parasitic transistor 120 when ESD switching circuitry 116 is switched-on (706). In some examples, signal limiter 124 electrically couples first rail 108 and the emitter of parasitic transistor 120.

The following examples may illustrate one or more aspects of the disclosure.

Example 1. A circuit comprising: a first rail for one or more first electrical components formed in a first portion of a substrate; electrostatic discharge (ESD) protection circuitry electrically coupled between the first rail and a reference rail, wherein the ESD protection circuitry is configured to generate an electrically conductive path between the first rail and the reference rail during an ESD event; a second rail for one or more second electrical components formed in a second portion of the substrate, wherein the first portion of the substrate forms an emitter of a parasitic transistor and the second portion of the substrate forms a collector of the parasitic transistor; an ESD switching circuitry electrically coupled between the second rail and the reference rail, wherein the ESD switching circuitry is configured to switch on during the ESD event to generate an electrically conductive path between the second rail and the reference rail; biasing circuitry configured to output a bias voltage at the emitter of the parasitic transistor when the ESD switching circuitry is switched on; and a signal limiter configured to electrically couple the first rail and the emitter of the parasitic transistor.

Example 2. The circuit of example 1, wherein the signal limiter comprises a diode comprising an anode electrically coupled to the first rail and a cathode electrically coupled to the emitter of the parasitic transistor.

Example 3. The circuit of any combination of examples 1-2, wherein the signal limiter comprises a resistive element comprising a first node electrically coupled to the first rail and a second node electrically coupled to the emitter of the parasitic transistor.

Example 4. The circuit of any combination of examples 1-3, wherein the first portion of the substrate comprises a first N-type layer; and wherein the second portion of the substrate comprises a second N-type layer.

Example 5. The circuit of any combination of examples 1-4, wherein the first N-type layer and the second N-type layer are separated by deep trench isolation.

Example 6. The circuit of any combination of examples 1-5, wherein the first N-type layer and the second N-type layer are formed on a common P-type layer.

Example 7. The circuit of any combination of examples 1-6, wherein the ESD protection circuitry comprises a diode comprising an anode electrically coupled to the reference rail and a cathode electrically coupled to the first rail.

Example 8. The circuit of any combination of examples 1-7, wherein the diode is a Zener diode.

Example 9. The circuit of any combination of examples 1-8, wherein the parasitic transistor is a first parasitic transistor and wherein the diode comprises a second parasitic transistor, the second parasitic transistor comprising an emitter electrically coupled to the first rail, a collector electrically coupled to the emitter of the first parasitic transistor, and a base electrically coupled to the reference rail.

Example 10. The circuit of any combination of examples 1-9, wherein the ESD protection circuitry comprises a switching element comprising a first node electrically coupled to the reference rail and a second node electrically coupled to the first rail and wherein, to generate the electrically conductive path between the first rail and the reference rail during the ESD event, the switching element is configured to switch on.

Example 11. The circuit of any combination of examples 1-10, wherein when the ESD protection circuitry generates the electrically conductive path between the first rail and the reference rail during the ESD event, the ESD protection circuitry drives voltage at the first rail to be less than voltage at the reference rail; and wherein the biasing circuitry is configured to output the bias voltage to be greater than voltage at the reference rail during the ESD event.

Example 12. The circuit of any combination of examples 1-11, wherein the ESD switching circuitry comprises: a pass element comprising a control node, a first node electrically coupled to the second rail, and a second node electrically coupled to the reference rail.

Example 13. The circuit of any combination of examples 1-12, wherein the biasing circuitry comprises: a diode comprising an anode and cathode, the cathode of the diode being electrically coupled to the emitter of the parasitic transistor; and a source-follower element comprising a control node electrically coupled to the control node of the pass element, a first node electrically coupled to the second rail, and a second node electrically coupled to the anode of the diode.

Example 14. The circuit of any combination of examples 1-13, wherein the ESD switching circuitry comprises: triggering circuitry comprising one or more triggering elements arranged in a series string, wherein a first end of the series string is electrically coupled to the second rail and a second end of the series string is electrically coupled to the control node of the pass element; and a resistance element comprising a first node electrically coupled to the control node of the pass element and a second node electrically coupled to the reference rail.

Example 15. The circuit of any combination of examples 1-14, wherein the ESD switching circuitry comprises an RC trigger element.

Example 16. The circuit of any combination of examples 1-15, wherein the parasitic transistor is a first parasitic transistor, wherein the biasing circuitry is further configured to output, via a second diode, the bias voltage at an emitter of a second parasitic transistor when the ESD switching circuitry is switched on.

Example 17. The circuit of any combination of examples 1-16, wherein the ESD switching circuitry comprises a switching element configured to switch on during the ESD event; or wherein the ESD switching circuitry comprises a PN-type device with a P-junction electrically coupled to the reference rail.

Example 18. The circuit of any combination of examples 1-17, wherein the first rail is a supply rail, the second rail is a supply rail, or the first rail and the second rail are supply rails; or wherein the first rail is an Input/Output (I/O) rail, the second rail is an I/O rail, or the first rail and the second rail are I/O rails.

Example 19. A method comprising: generating, by electrostatic discharge (ESD) protection circuitry, an electrically conductive path between a first rail and a reference rail during an ESD event, wherein the first rail is configured for one or more first electrical components formed in a first portion of a substrate; switching-on an ESD switching circuitry electrically coupled between a second rail and the reference rail during the ESD event to generate an electrically conductive path between the second rail and the reference rail, wherein the second rail is configured for one or more second electrical components formed in a second portion of the substrate, wherein the first portion of the substrate forms an emitter of a parasitic transistor and the second portion of the substrate forms a collector of the parasitic transistor; and output a bias voltage at the emitter of the parasitic transistor when the ESD switching circuitry is switched-on, wherein a signal limiter electrically couples the first rail and the emitter of the parasitic transistor.

Example 20. A system comprising: a reference rail; one or more first electrical components formed in a first portion of a substrate; a first rail for the one or more first electrical components; electrostatic discharge (ESD) protection circuitry electrically coupled between the first rail and the reference rail, wherein the ESD protection circuitry is configured to generate an electrically conductive path between the first rail and the reference rail during an ESD event; one or more second electrical components formed in a second portion of the substrate, wherein the first portion of the substrate forms an emitter of a parasitic transistor and the second portion of the substrate forms a collector of the parasitic transistor; a second rail for the one or more second electrical components; an ESD switching circuitry electrically coupled between the second rail and the reference rail, wherein the ESD switching circuitry is configured to switch on during the ESD event to generate an electrically conductive path between the second rail and the reference rail; biasing circuitry configured to output a bias voltage at the emitter of the parasitic transistor when the ESD switching circuitry is switched-on; and a signal limiter configured to electrically couple the first rail and the emitter of the parasitic transistor.

Various aspects have been described in this disclosure. These and other aspects are within the scope of the following claims.

The invention claimed is:

1. A circuit comprising:
    a first rail for one or more first electrical components formed in a first portion of a substrate;
    electrostatic discharge (ESD) protection circuitry electrically coupled between the first rail and a reference rail, wherein the ESD protection circuitry is configured to generate an electrically conductive path between the first rail and the reference rail during an ESD event;
    a second rail for one or more second electrical components formed in a second portion of the substrate, wherein the first portion of the substrate forms an emitter of a parasitic transistor and the second portion of the substrate forms a collector of the parasitic transistor;
    an ESD switching circuitry electrically coupled between the second rail and the reference rail, wherein the ESD switching circuitry is configured to switch on during the ESD event to generate an electrically conductive path between the second rail and the reference rail;
    biasing circuitry configured to output a bias voltage at the emitter of the parasitic transistor when the ESD switching circuitry is switched on; and
    a signal limiter configured to electrically couple the first rail and the emitter of the parasitic transistor.

2. The circuit of claim 1, wherein the signal limiter comprises a diode comprising an anode electrically coupled to the first rail and a cathode electrically coupled to the emitter of the parasitic transistor.

3. The circuit of claim 1, wherein the signal limiter comprises a resistive element comprising a first node electrically coupled to the first rail and a second node electrically coupled to the emitter of the parasitic transistor.

4. The circuit of claim 1,
    wherein the first portion of the substrate comprises a first N-type layer; and
    wherein the second portion of the substrate comprises a second N-type layer.

5. The circuit of claim 4, wherein the first N-type layer and the second N-type layer are separated by deep trench isolation.

6. The circuit of claim 4, wherein the first N-type layer and the second N-type layer are formed on a common P-type layer.

7. The circuit of claim 1, wherein the ESD protection circuitry comprises a diode comprising an anode electrically coupled to the reference rail and a cathode electrically coupled to the first rail.

8. The circuit of claim 7, wherein the diode is a Zener diode.

9. The circuit of claim 7, wherein the parasitic transistor is a first parasitic transistor and wherein the diode comprises a second parasitic transistor, the second parasitic transistor comprising an emitter electrically coupled to the first rail, a collector electrically coupled to the emitter of the first parasitic transistor, and a base electrically coupled to the reference rail.

10. The circuit of claim 1, wherein the ESD protection circuitry comprises a switching element comprising a first node electrically coupled to the reference rail and a second node electrically coupled to the first rail and wherein, to generate the electrically conductive path between the first rail and the reference rail during the ESD event, the switching element is configured to switch on.

11. The circuit of claim 1,
    wherein when the ESD protection circuitry generates the electrically conductive path between the first rail and the reference rail during the ESD event, the ESD protection circuitry drives voltage at the first rail to be less than voltage at the reference rail; and
    wherein the biasing circuitry is configured to output the bias voltage to be greater than voltage at the reference rail during the ESD event.

12. The circuit of claim 1, wherein the ESD switching circuitry comprises:
    a pass element comprising a control node, a first node electrically coupled to the second rail, and a second node electrically coupled to the reference rail.

13. The circuit of claim 12, wherein the biasing circuitry comprises:
    a diode comprising an anode and cathode, the cathode of the diode being electrically coupled to the emitter of the parasitic transistor; and
    a source-follower element comprising a control node electrically coupled to the control node of the pass element, a first node electrically coupled to the second rail, and a second node electrically coupled to the anode of the diode.

14. The circuit of claim 12, wherein the ESD switching circuitry comprises:
    triggering circuitry comprising one or more triggering elements arranged in a series string, wherein a first end of the series string is electrically coupled to the second rail and a second end of the series string is electrically coupled to the control node of the pass element; and
    a resistance element comprising a first node electrically coupled to the control node of the pass element and a second node electrically coupled to the reference rail.

15. The circuit of claim 12, wherein the ESD switching circuitry comprises an RC trigger element.

16. The circuit of claim 1, wherein the parasitic transistor is a first parasitic transistor, wherein the biasing circuitry is further configured to output, via a second diode, the bias voltage at an emitter of a second parasitic transistor when the ESD switching circuitry is switched on.

17. The circuit of claim 1,
    wherein the ESD switching circuitry comprises a switching element configured to switch on during the ESD event; or
    wherein the ESD switching circuitry comprises a PN-type device with a P-junction electrically coupled to the reference rail.

18. The circuit of claim 1,
    wherein the first rail is a supply rail, the second rail is a supply rail, or the first rail and the second rail are supply rails; or
    wherein the first rail is an Input/Output (I/O) rail, the second rail is an I/O rail, or the first rail and the second rail are I/O rails.

19. A method comprising:
    generating, by electrostatic discharge (ESD) protection circuitry, an electrically conductive path between a first rail and a reference rail during an ESD event, wherein the first rail is configured for one or more first electrical components formed in a first portion of a substrate;

switching-on an ESD switching circuitry electrically coupled between a second rail and the reference rail during the ESD event to generate an electrically conductive path between the second rail and the reference rail, wherein the second rail is configured for one or more second electrical components formed in a second portion of the substrate, wherein the first portion of the substrate forms an emitter of a parasitic transistor and the second portion of the substrate forms a collector of the parasitic transistor; and outputting a bias voltage at the emitter of the parasitic transistor when the ESD switching circuitry is switched-on, wherein a signal limiter electrically couples the first rail and the emitter of the parasitic transistor.

20. A system comprising:

a reference rail;

one or more first electrical components formed in a first portion of a substrate;

a first rail for the one or more first electrical components;

electrostatic discharge (ESD) protection circuitry electrically coupled between the first rail and the reference rail, wherein the ESD protection circuitry is configured to generate an electrically conductive path between the first rail and the reference rail during an ESD event;

one or more second electrical components formed in a second portion of the substrate, wherein the first portion of the substrate forms an emitter of a parasitic transistor and the second portion of the substrate forms a collector of the parasitic transistor;

a second rail for the one or more second electrical components;

an ESD switching circuitry electrically coupled between the second rail and the reference rail, wherein the ESD switching circuitry is configured to switch on during the ESD event to generate an electrically conductive path between the second rail and the reference rail;

biasing circuitry configured to output a bias voltage at the emitter of the parasitic transistor when the ESD switching circuitry is switched-on; and a signal limiter configured to electrically couple the first rail and the emitter of the parasitic transistor.

* * * * *